United States Patent
Young

(10) Patent No.: US 7,666,778 B2
(45) Date of Patent: Feb. 23, 2010

(54) METHOD OF ARRANGING SOLDER BALLS FOR BALL GRID ARRAY PACKAGES

(75) Inventor: Dave W. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 217 days.

(21) Appl. No.: 11/827,220

(22) Filed: Jul. 11, 2007

(65) Prior Publication Data

US 2007/0254467 A1 Nov. 1, 2007

Related U.S. Application Data

(62) Division of application No. 10/787,563, filed on Feb. 24, 2004, now Pat. No. 7,259,453.

(51) Int. Cl.
*H01L 21/4763* (2006.01)

(52) U.S. Cl. ............... 438/613; 438/612; 438/E23.069
(58) Field of Classification Search ......... 438/612–613; 257/737–738, 778–779
See application file for complete search history.

(56) References Cited

U.S. PATENT DOCUMENTS

| 6,268,568 B1 * | 7/2001 | Kim .................... 174/250 |
| 2004/0036176 A1 * | 2/2004 | Singh et al. ............ 257/773 |

* cited by examiner

*Primary Examiner*—Dung A. Le
(74) *Attorney, Agent, or Firm*—Trop, Pruner & Hu, P.C.

(57) ABSTRACT

A method of arranging solder balls in a hexagonal array on an integrated circuit package is disclosed. Arranging the solder balls in a hexagonal array may increase the solder ball density, reducing solder ball fatigue. In some embodiments, the solder balls are arranged in the hexagonal array under the die shadow and in an orthogonal array outbound of the die shadow.

5 Claims, 2 Drawing Sheets

METHOD OF ARRANGING SOLDER BALLS FOR BALL GRID ARRAY PACKAGES

CROSS-REFERENCE TO RELATED APPLICATIONS

This application is a divisional of U.S. patent application Ser. No. 10/787,563, filed on Feb. 24, 2004 now U.S. Pat. No. 7,259,453.

BACKGROUND

This invention relates generally to packages for electronic devices.

Electronic devices may be packaged in a variety of different package styles. Surface mount packages are particularly desirable because they enable the packages to be secured to printed circuit boards or other devices through the application of heat.

Solder balls may be placed in an array on the underside of the electronic component coupled to lands in the electronic component. These lands are connected by interconnections to the various input and output nodes of the integrated circuit. The balls may be positioned on lands on the printed circuit board. When the structure is heated, the solder balls soften and bond to the lands on the printed circuit board, forming mechanical and electrical connections.

The strength of the connection between the solder balls, the component, and the printed circuit board is an area of considerable concern. Fatigue may occur in these connections. Such fatigue generally results in failure of the electronic device that uses the component.

Thus, there is a need for alternate ways to provide ball grid array packages with improved solder fatigue resistance.

DETAILED DESCRIPTION

Figure 1:
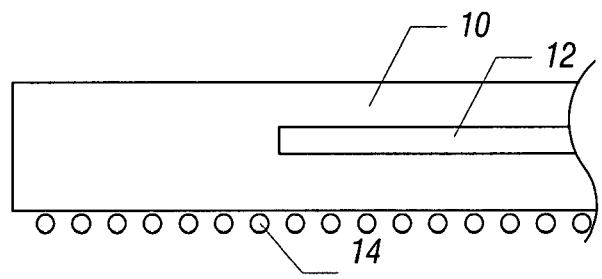
FIG. 1 is a partial, enlarged, cross-sectional view through one embodiment of the present invention.

Referring to FIG. 1, a ball grid array package 10 may include an integrated circuit chip 12. On the underside of the package 10 are a number of solder balls 14. The solder balls 14 outbound of the region underlying the integrated circuit 12 are less prone to metal fatigue failure. However, the solder balls in the region underneath the integrated circuit 12 are particularly prone to fatigue failure.

Figure 2:
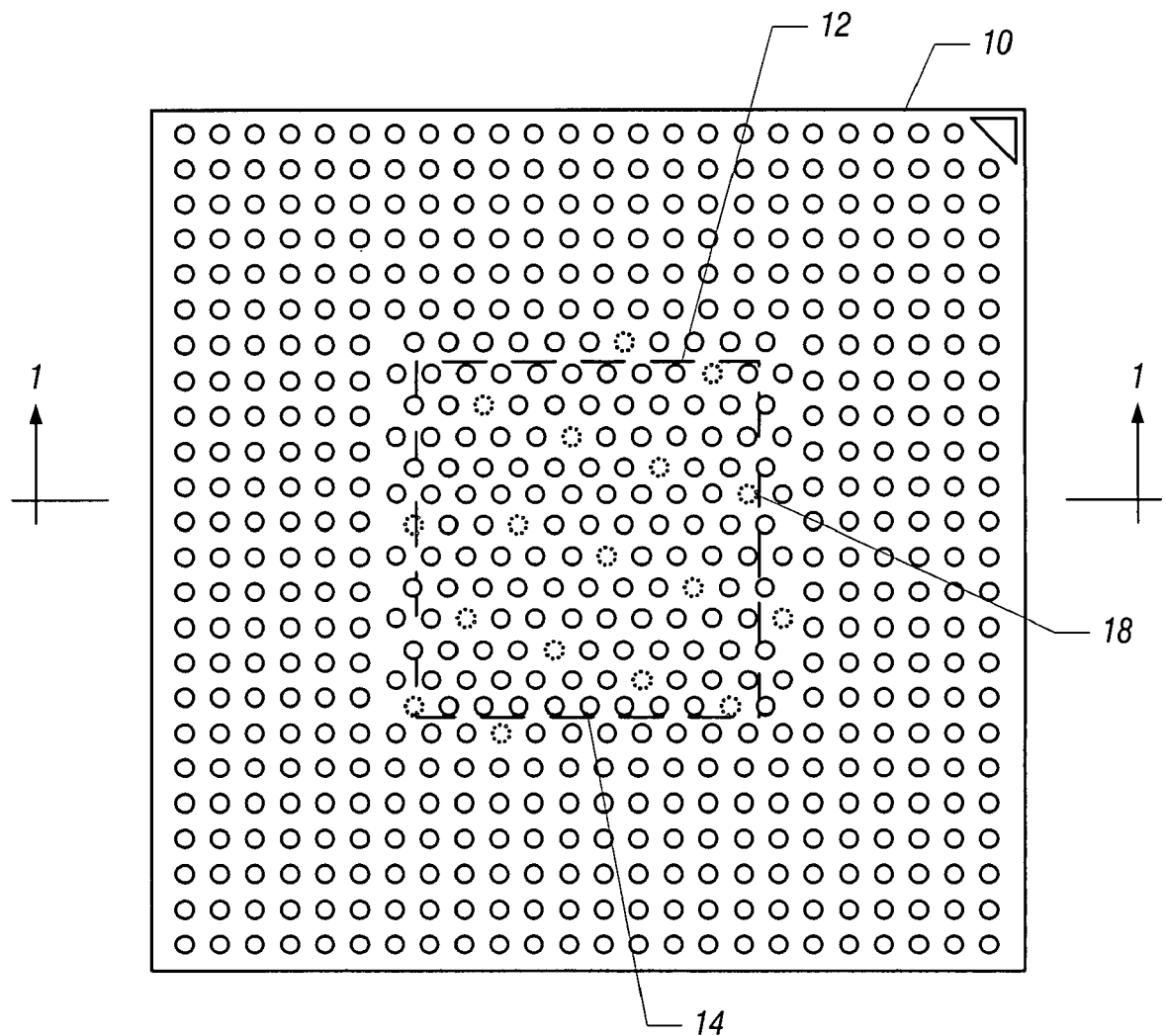
FIG. 2 is a bottom plan view of the embodiment shown in FIG. 1.

Referring to FIG. 2, there are two basic regions of solder balls. There are solder balls 14 underneath the integrated circuit 12 and solder balls 14 outbound thereof. In FIG. 2, the shadow of the integrated circuit 12 is indicated by the dashed rectangle 10.

The solder balls 14 outbound of the shadow region may be arranged in an orthogonal array of rows and columns. Solder balls 14 inbound of the shadow region may be arranged in a hexagonal array. This arrangement may increase solder ball density in the sensitive region underneath the integrated circuit 12.

Increasing solder ball density without a change in minimum ball pitch may, in some embodiments, reduce solder fatigue resistance. In some embodiments, solder joint density may be increased by 15 percent without changing pitch.

The hexagonal array may extend the strain over an increased number of solder joints, thereby reducing damage to any single joint and extending fatigue life. This is because solder fatigue resistance is reduced by increasing the total pad area. The benefits of increasing the total pad area may be realized by increasing the total pad area in the high strain region underneath the die shadow in the case of ball grid array packages.

Figure 3:
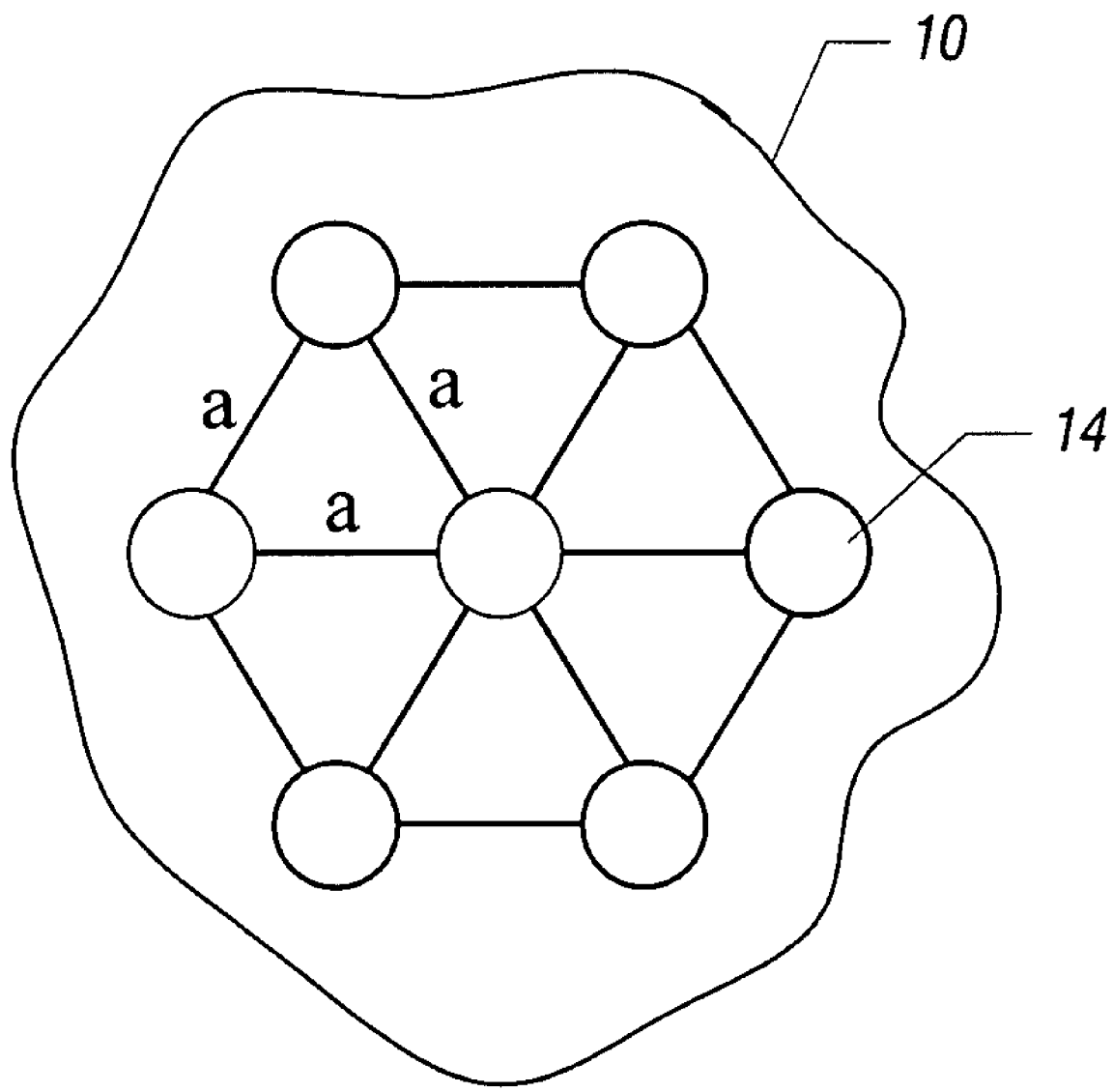
FIG. 3 is a schematic depiction of a portion of the figure shown in FIG. 2 in accordance with one embodiment of the present invention.

Packing density theorems demonstrate that ball density, in terms of balls per unit area, is increased with a hexagonal structure. For example, the structure shown in FIG. 3 has a ball density of 1.15 balls per unit area, whereas an orthogonal array, with the same ball size, would have a density of 1 ball per unit area.

As shown in FIG. 2, the hexagonal portion of the array may, in some cases, extend beyond the die shadow pending signal routing schemes. Via pads 18 may be substitutional with solder pads in some embodiments. Interstitial vias may involve a pad shrink versus an orthogonal array.

Thus, in some embodiments of the present invention, ball density may be increased without changing pitch. Increased ball density may reduce solder fatigue resistance in some embodiments. In some embodiments, it is most advantageous to reduce solder fatigue resistance in the region underneath the integrated circuit die 12.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   arranging solder balls on a semiconductor integrated circuit package including arranging solder balls centrally in a hexagonal array and arranging solder balls outbound of the hexagonal array, wherein the solder balls in the hexagonal array are arranged more densely than the solder balls arranged outbound of the hexagonal array.

2. The method of claim 1 including arranging the solder balls on a semiconductor integrated circuit package in a hexagonal array in the region underneath the integrated circuit.

3. The method of claim 2 including arranging the solder balls in an orthogonal array outbound of the region underneath the integrated circuit.

4. The method of claim 1 including providing less than all of the solder balls on a semiconductor integrated circuit package in a hexagonal array.

5. The method of claim 1 including arranging solder balls centrally in a hexagonal array and peripherally in an orthogonal array.

* * * * *